United States Patent [19]
Ferber et al.

[11] Patent Number: 5,626,948
[45] Date of Patent: May 6, 1997

[54] ELECTRICAL SYSTEM HAVING A MULTILAYER CONDUCTIVE COMPOSITION

[75] Inventors: Andrew R. Ferber, New York, N.Y.; Terrance Z. Kaiserman, Loxahatchee, Fla.; Adrian I. Rose, Gillette, N.J.

[73] Assignee: Ferber Technologies L.L.C., Roseland, N.J.

[21] Appl. No.: 582,486

[22] Filed: Jan. 3, 1996

[51] Int. Cl.$^6$ ............................................. B32B 9/00
[52] U.S. Cl. .................... 428/195; 428/206; 428/320.2; 428/327; 428/209; 200/262; 200/265; 446/91
[58] Field of Search .................... 362/103, 252, 362/800, 806; 428/114, 323, 320.2, 327, 206, 195; 204/281; 446/91

[56] References Cited

U.S. PATENT DOCUMENTS

| | | | |
|---|---|---|---|
| 3,912,668 | 10/1975 | Neumann et al. | 260/18 PN |
| 5,024,826 | 6/1991 | Linton | 423/335 |
| 5,104,583 | 4/1992 | Richardson | 252/518 |
| 5,178,736 | 1/1993 | Richardson | 204/181.1 |
| 5,203,975 | 4/1993 | Richardson | 204/181.1 |
| 5,236,737 | 8/1993 | Linton | 427/126.3 |
| 5,334,330 | 8/1994 | Rowlette | 252/512 |
| 5,362,421 | 11/1994 | Kropp et al. | 252/512 |
| 5,362,513 | 11/1994 | Shimada et al. | 427/58 |
| 5,371,657 | 12/1994 | Wiscombe | 362/103 |
| 5,372,697 | 12/1994 | Akutsu | 205/50 |
| 5,455,749 | 10/1995 | Ferber | 362/103 |

*Primary Examiner*—William Krynski
*Assistant Examiner*—Cathy F. Lam
*Attorney, Agent, or Firm*—Lerner, David, Littenberg, Krumholz & Mentlik

[57] ABSTRACT

An electrical system including a multi-layer conductive composition is disclosed. The multi-layer conductive composition includes at least a first composition, which may be a bottom composition layer, and a second composition, which may be a top composition layer, arranged on a substrate. The bottom composition layer has a greater level of conductivity than the top composition layer. In one preferred embodiment, the multi-layer conductive composition may be vertically conductive. In this preferred embodiment, the conductivity of the top composition layer may be selected so that electric current is permitted to flow along the z axis, but not along the x and y axes thereof. The electric current can flow along the x, y and z axes of the bottom composition layer. The top composition layer may mask the bottom composition layer. Further, the top composition may comprise a substantial amount of pigment so that multi-layer conductive composition has a desired color.

23 Claims, 3 Drawing Sheets

ELECTRICAL SYSTEM HAVING A MULTILAYER CONDUCTIVE COMPOSITION

FIELD OF THE INVENTION

The present invention relates to conductive compositions for use in connection with electrical systems.

BACKGROUND OF THE INVENTION

Conductive compositions have been developed for various purposes including facilitating electrostatic discharge and as a current transfer medium on printed circuit boards. Recently, conductive compositions have been used, instead of conventional conductive wires, as part of electrical systems. In particular, conductive compositions have been used as a means for conducting current from a power source to current operated modules on a variety of objects such as wearing apparel and children's toys.

Examples of desirable electrical systems which use conductive compositions are disclosed in U.S. Pat. No. 5,455, 749 which is assigned to the applicant of the present invention and which is incorporated by reference herein. The '749 patent discloses electrical systems which include a power supply, one or more current operated modules and conductive composition for connecting the power supply to the current operated module so that current generated by the power supply can be delivered to the current operating module. In one embodiment, the conductive composition may be colored where the coloring constitutes a substantially nonconductive portion of the conductive composition. In another embodiment, the conductive composition is arranged on an object and forms at least a portion of a design thereon. In another embodiment, the conductive composition includes features which render it sufficiently durable to withstand multiple washes without cracking, substantial resistance build-up or other failure. The aforementioned properties of the conductive compositions disclosed in the '749 patent are desirable in various applications.

Efforts have also been expended to develop conductive compositions which are anistropically electrically conductive. Such anistropic conductive compositions will permit substantial current to flow in the z direction (i.e., normal to the plane of the composition surface), but will prohibit substantial current flow along the x and y directions within the conductive composition (i.e., parallel to the plane of the conductive composition surface). Although this characteristic is desirable, no known anistropic conductive composition includes a pigment. Further, anistropic conductive compositions utilize a single layer composition which includes conductive particles having diameters which vary at different locations within the composition. This features is entirely different from the conductive compositions used in connection with the present invention which will always have at least a first and second layer of different compositions used in combination with each other with the first layer placed on a substrate and a second layer placed on top of the first layer.

U.S. Pat. No. 5,203,975 to Richardson discloses a process for cathodic electrodeposition of a clear coating over a layer of conductive paint. The '975 patent also discloses that multiple layers of conductive composition may be applied to automobile panels and the like. However, the '975 patent does not teach the use of multiple layers of conductive composition in connection with an electrical system. Further, there is no disclosure or teaching in the '975 patent of the concept of applying multiple layers of conductive composition on an object wherein the lower layer includes greater conductivity than an upper layer in order to achieve the concept of "vertical conductivity" which will be discussed in detail hereinbelow.

As used herein, the term substrate includes the surface of any article or object which may be used for consumer or industrial purposes. Further, the substrate may include such articles or objects which have one or more layers of composition applied to the surface thereof beneath the multi-layer conductive composition of the present invention. Examples of such substrates include wearing apparel, toys, furniture, walls, dashboards of automobiles, various electrical, electronic and mechanical devices, etc.

A need has arisen for colored conductive compositions which are available in a wide variety of colors to be used as part of an electrical system on the surface of substrates. For example, it may be desirable to provide a colored conductive composition which has sufficient pigment therein to precisely match the color of an article. It may also be desirable to provide a colored conductive composition which is available in a wide range of vibrant or specific colors.

The prior art has also failed to provide a conductive composition for use as part of an electrical system which is vertically conductive, as defined herein, and which comprises multiple layers wherein the top layer masks one or more lower layers. The present invention addresses the aforementioned shortcomings and needs of the prior art.

SUMMARY AND OBJECTS OF THE INVENTION

The present invention provides a multi-layer conductive composition for use in connection with an electrical system which comprises a power source for supplying current and at least one current operated module adapted to provide an output response to applied current received from the power source. A substrate is also provided and a multi-layer conductive composition is arranged on a substrate for providing an electrical current path between the power source and the at least one current operated module. The multi-layer conductive composition comprises a first composition which may be considered a bottom composition layer and which has a sufficient amount of electrically conductive material therein to provide a first level of conductivity. A second composition is also provided which includes a relatively small amount of electrically conductive material to provide the second composition with a second level of conductivity which is lower than the first level of conductivity of the first composition. The second composition may be considered a top composition layer and is arranged on the bottom composition layer.

In a preferred embodiment, the second level of conductivity of the second composition is selected so that substantial electrical current can flow along the z axis thereof while electric current is substantially prevented from flowing along the x and y axes thereof. The first level of conductivity of the first composition is such that electric current transmitted to the first composition will be permitted to flow along the x, y and z axes thereof. Thus, the multi-layer conductive composition is "vertically" conductive. That is, current is permitted to flow normal to the surface of the combination of the first and second layers of conductive composition, but is not permitted to flow within the top layer of the conductive composition parallel to the surface thereof.

As used herein, the term "current operated module" is intended to cover any device or assembly which produces an output response to current. Examples of current operated modules include light emitting diodes, sound generating devices, various types of electronic circuit elements, components of electrically actuated motors, other electrically actuated machinery, and the like.

The substrate on which the multi-layer conductive composition is arranged may comprise various articles or objects as discussed above. Further, the substrate may include one or more base layers of other compositions below the multi-layer conductive composition of the present invention. When arranged on the substrate, the multi-layer conductive composition of the present invention may comprise two or more composition layers. It is important that the outermost layer, or top composition layer, of the present multi-layer conductive composition has a conductivity which is less than the conductivity of a bottom composition layer arranged therebelow. In a preferred embodiment, the conductivity of the bottom composition layer is substantially greater than the conductivity of the top composition layer so that the vertical conductivity aspect of the present invention may be obtained.

The first composition may comprise a resin and a vehicle in which the resin is dissolved or dispersed. The second composition may also comprise a resin and a vehicle in which the resin is dissolved or dispersed. Further, the second composition preferably comprises a pigment present in an amount to provide a desired color thereto. The first layer of composition may also comprise a pigment.

In a preferred embodiment, the electrically conductive material of the first layer of composition is present in an amount of between about 5%–80% thereof. The electrically conductive material may comprise any known conductive elements and is preferably selected from the group consisting of precious metals and non-precious metals.

The resin of the first composition may be present in an amount of between about 5%–60% thereof. The resin may comprise various known materials which have the desired binding characteristics to bind the additional ingredients of the conductive composition. The resin is preferably selected from the group consisting of acrylics, urethanes, epoxies and oxidizing materials.

The vehicle of the first composition may be present in an amount of between about 5%–75% thereof. The vehicle may comprise various solvents and other liquids in which the resin is dissolved or dispersed. Such solvents and other liquids may include aliphatic solvents, aromatic solvents, terpene solvents, alcohols, esters, chlorinated solvents, ether esters, ketones, glycols, glycol ethers, plasticizers, surfactants, polyols, defoamers, rosins, crosslinkers, silanes, dispersants and water. As used herein, the term dispersed is intended to cover embodiments wherein resin is carried by a liquid, rather than being truly dissolved therein. A liquid dispersion medium may be a medium in which the resin is dispersed, but in which other materials may be truly dissolved.

The first composition may also comprise at least one ingredient selected from the group consisting of flow agents, defoamers, wetting agents, cross-linking agents and curing agents.

In a preferred embodiment, the second composition layer of the multi-layer conductive composition may comprise electrically conductive material in an amount of between about 1%–55% thereof.

In another preferred embodiment, the particular amount of electrically conductive material present in the second composition layer, or top composition layer, of the multi-layer conductive composition should be selected so that the vertical conductivity objective of the present invention may be achieved.

Various electrically conductive materials may be used in the second composition layer. Preferably, the electrically conductive materials of the second composition layer are selected from the group consisting of precious metals and non-precious metals.

The second composition layer also preferably comprises a resin and a vehicle in which the resin is dissolved or dispersed. Additionally, the second composition layer preferably comprises a pigment which is present in an amount sufficient to provide a desired color thereto. The resin of the second composition may be present in various amounts and is preferably present in an amount of between about 5%–75% thereof. Various resins may be used. The resin of the second composition may be the same as the resin of the first composition discussed above.

The vehicle in which the resin is dissolved or dispersed in the second composition may also be present in various amounts and is preferably present in an amount between about 5%–60% thereof. The vehicle may be the same as the vehicle of the first composition discussed above.

The second composition may also comprise at least one ingredient selected from the group consisting of flow agents, defoamers, wetting agents, cross-linking agents and curing agents.

The pigment present in the second composition layer may be present in various amounts and is preferably present in an amount between about 1%–60% thereof. The percentage of pigment of the second composition layer may be substantially greater than the percentage of pigments in prior art conductive compositions. This is possible because the second composition layer may only be minimally conductive. To this end, it may have less conductive particles and a higher percentage of pigment than prior art conductive compositions. In a preferred embodiment, the minimally conductive second composition layer is merely vertically conductive, as opposed to entirely conductive. In a preferred embodiment, the pigment is a substantially electrically non-conductive material of the second composition layer. In alternate embodiments, the pigment may be an inherent part of the electrically conductive materials or the resin of the second composition layer.

The present invention also contemplates use of the multi-layer conductive composition discussed herein in environments which do not require the preferred electrical system. Thus, although one particularly desirable aspect of the present multi-layer conductive composition is its use in connection with electrical systems, it should be appreciated that it can be used in environments which do not require a power source or current operated modules.

It is an object of the present invention to provide a conductive composition which has a more versatile or desirable colored appearance than has heretofore been achieved. Such an appearance may require the ability to match the color of the conductive composition with the color of nonconductive portions of an object on which it is applied. Other desirable appearances may require that the colored conductive composition has a specific color or a more vibrant color than prior art conductive compositions.

It is a further object of the present invention to provide an electrical system which uses multi-layer conductive compositions as means for transmitting current flow wherein a top composition layer is used to mask one or more lower composition layers.

It is still another object of the present invention to provide a multi-layer conductive composition which is vertically conductive so that current operated modules can be selectively actuated by contacting the surface of the multi-layer conductive composition in a desired location, while preventing a short circuit when the surface of the multi-layer conductive composition is contacted in an undesirable location.

Further objects and advantages of the present invention will be more apparent when considered in combination with the following detailed description and drawings.

DETAILED DESCRIPTION OF THE PREFERRED EMBODIMENTS

Figure 1:
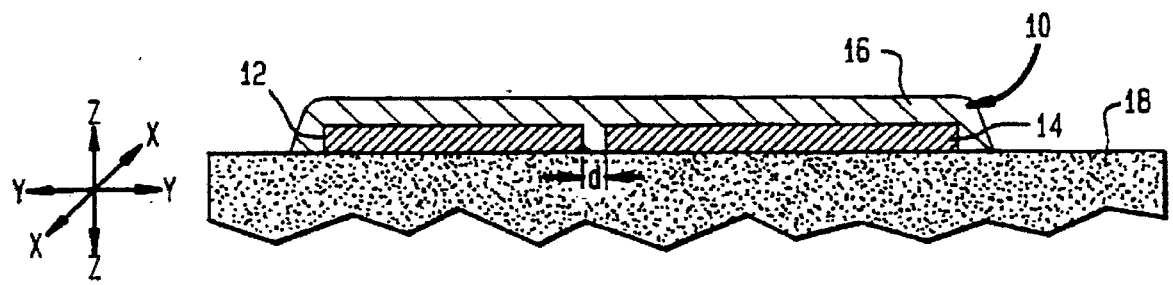
FIG. 1 is an enlarged cross-sectional isolated schematic view of one embodiment of the present multi-layer conductive composition.

A multi-layer conductive composition in accordance with the present invention is denoted by reference numeral 10 in FIG. 1. It should be appreciated that although the multi-layer conductive composition 10 will be described in preferred embodiments herein as comprising two composition layers (such as a top composition layer and a bottom composition layer), alternate embodiments may include three or more composition layers in combination with each other. In all embodiments, the outermost composition layer (i.e., the top composition layer) will be less conductive than at least one of the composition layers arranged therebelow.

The multi-layer conductive composition 10 is depicted in an isolated cross-sectional view in FIG. 1 as comprising first and second composition layers arranged on a substrate. The first composition layer will be referred to herein as the bottom composition layer and the second composition layer will be referred to herein as the top composition layer. The bottom composition layer is shown in FIG. 1 as comprising a pair of spaced portions 12 and 14 separated by a relatively small distance d. The portions 12 and 14 of the bottom layer are arranged on a substrate 18 which may be the surface of any article or object which may be used for consumer or industrial purposes. For example, substrate 18 may represent wearing apparel, toys, furniture, walls, dashboards of automobiles, various electrical, electronic and mechanical devices, etc.

The top composition layer 16 of the multi-layer conductive composition 10 is shown in FIG. 1 as being arranged immediately adjacent the spaced portions 12 and 14 of the bottom layer.

The particular materials which are included in the top and bottom composition layers of the multi-layer conductive composition may vary as a matter of design choice while remaining within the scope of the present invention. However, the top and bottom composition layers should be compatible to obtain suitable intercomposition adhesion and to assure that the desired properties thereof are not adversely affected by corrosion or other chemical reactions.

In alternate embodiments of the present invention, the bottom composition layer may be represented by a continuous composition, as opposed to spaced portions 12 and 14 of FIG. 1. However, for the purpose of describing a preferred use of the multi-layer conductive composition 10, the bottom composition layer has been described in the preferred embodiments of FIGS. 1–6 as comprising a pair of spaced identical conductive compositions. The overall multi-layer conductive composition 10 will nevertheless have the aesthetic external appearance of being at least substantially continuous due to the placement of a continuous top composition layer over the spaced portions of the bottom composition layer.

The top composition layer 16 need not be truly continuous. To this end, a process printing technique may be used. Process printing uses transparent inks layered on top of each other, combined with a halftone dot pattern. The layers of ink act like color filters and the halftone dots may selectively create the appearance of thousands of different colors. Process printing only requires use of the colors cyan, magenta and yellow. Black may also be used for line work or shading purposes. Thus, if a process printing technique is used, the top composition layer 16 may have the aesthetic appearance of being at least substantially continuous, although it would not constitute a truly continuous layer.

The spaced portions 12 and 14 of the bottom composition layer shown in FIG. 1 may comprise identical conductive compositions. The ingredients may include a conductive material, one or more resins dissolved or dispersed in a solvent or a mixture of solvents or other liquids, and other materials such as flow control agents, defoamers, wetting agents, crosslinking agents and curing agents. In various preferred uses of the present multi-layer conductive composition, the bottom composition layer may not be visible when the multi-layer conductive composition is used as part of an electrical system. Thus, it is not required to include pigments in the bottom layer to achieve coloring thereof. However, pigments may be included for aesthetic reasons, particularly where the top composition layer does not have sufficient "hiding" properties to completely cover (i.e., mask) the bottom composition layer. This aspect of the present invention will be discussed further below.

It should be appreciated that the top composition layer may be tectured in order to mask the bottom composition layer. To this end, texturing may be used in combination with, or in lieu of, the use of a pigment to obtain the desired masking effect. Expandable microspheres are examples of one type of texturing agent which may be used in accordance with the present invention. Such expandable microspheres may include vinylidene chloride/acrylonitrile copolymers with encapsulated isobutane as a blowing agent.

The bottom composition layer may also be applied as a bulk coating layer, in which case it need not include any solvent. Examples of bulk coating layers include UV coatings, plastisol and powder coatings.

As stated above, the present multi-layer conductive composition may comprise two or more layers. However, in all embodiments of the present invention, the multi-layer conductive composition will include at least a first and a second composition layer wherein the top composition layer comprises a conductivity which is less than the conductivity of the bottom composition layer. The combination of the top and bottom composition layers including the composition discussed herein provides enhanced conductive and decorative properties that cannot be achieved with a single composition layer.

The bottom composition layer preferably comprises between about 5%–80% conductive material by weight. More preferably, the bottom layer comprises between about 30% and 65% of the conductive material by weight. The desirable range depends upon the conductive materials selected and on other ingredients in the system. A wide range of conductive materials may be used. It is preferable for the conductive materials of the bottom composition layer to provide a relatively high level of conductivity (i.e., a relatively low level of resistance which may be in the range of between about $0.1\Omega$–$1.0$ $M\Omega$ per square). It should be appreciated that the aforementioned ranges of conductivity/resistivity and the percentage of conductive material in the bottom composition layer is provided as an example of preferred ranges. Thus conductivity/resistivity levels above or below the aforementioned ranges may be obtained while remaining within the scope of the present invention.

The conductive materials should be consistent with the desired additional properties of the bottom composition layer including its washability, flexibility, and other desired properties. The conductive materials may be, but are not limited to, precious metals and non-precious metals such as base metal powders and flakes, inorganic powders coated with precious or base metals, graphite and elemental carbon powders, and various inorganic powders such as mica, $TiO_2$, silica, etc., coated with antimony doped tin oxide. Such powders need not be spherical or flake-like. For example, silver coated fiberglass particles can be used. Suitable non-precious metals include iron, copper, brass, bronze, aluminum and nickel as well as non-precious metal coated non-conducting particles. Other suitable non-precious conductive materials include materials marketed by E.I. Du Pont de Nemours under the trademarks ZELEC 1410M (antimony doped tin oxide on mica particles), ZELEC 1401T (antimony doped tin oxide on $TiO_2$ particles), and ZELEC 1610S (antimony doped tin oxide on silica particles) and GRAPHITE 850 from Asbury Graphite. Various conductive polymers doped polyacetylene, doped polypyrrole, doped polythiophene, doped polyaniline and the like may also be used. It should be appreciated that other conductive materials besides those discussed herein may be used while remaining within the scope of the present invention.

The bottom composition layer of the multi-layered conductive composition may contain between about 5%–60% resin by weight. More preferably, the bottom composition layer may contain between 15% and 35% of resin by weight. However, it should be appreciated that resin amounts greater or less than the ranges discussed herein may be used while remaining within the scope of the present invention.

The resins may be any of the resins typically used for surface coatings. To this end, examples of suitable resins include acrylamide, acrylics, phenolics, bisphenol A type epoxy, shellac, carboxymethyl cellulose, cellulose acetate butyrate, cullulosics, chlorinated polyether, chlorinated rubber, epoxy esters, ethylene vinyl acetate copolymers, maleics, melamine, natural resins, nitrocellulose solutions, isocyanates, hydrogenated resin, polyamide, polycarbonate, rosins, polyesters, polyethylene, polyolefins, polypropylene, polystyrene, polyurethane, polyvinyl acetate, silicone, vinyls, and water thinned resins. Additional suitable resins are described in the text entitled 1996 *Paint Red Book*, published by Modern Paint and Coatings Magazine, July 1995. Further the resins may include any other materials which have suitable binding properties to bind the conductive materials and other ingredients of the bottom layer composition together.

The selected resins may be either water soluble or soluble in an organic solvent based system. Alternatively, the resin may be dispersible a suitable liquid, rather than truly soluble therein. A liquid dispersion medium may be used in which the resin is dispersed, but in which other materials may be truly dissolved. The resin may be used with or without crosslinking. If crosslinking is desired, it may be obtained by using a crosslinking agent or by application of heat to the composition.

As stated above, the resin may be dissolved or dispersed in various liquids which serve as the vehicle for carrying the resin. The ingredients of the particular vehicle are not critical to the present invention. Thus, the bottom composition layer may be water based, or water miscible (including water dispersible), solvent based, plastisol based, etc. Further, as also stated above, the bottom composition layer may be applied as a bulk material system which does not require any solvents.

The bottom composition layer may optionally include selected amounts of colorant which will impart a desired color thereto. Since the bottom composition layer will often be entirely masked (i.e., hidden) by the top composition layer, it may not be necessary to include any such pigment therein. In this regard, the bottom composition layer can be contrasted with the top composition layer which, in most instances, will include a substantial amount of a colorant. As used herein, the term "colorant" is intended to include any substance that imparts color to a material. The colorant may comprise a dye or a pigment. Further, the colorant may be naturally present, admixed with a material such as dried pigments and paints, or applied in solution such as organic dyes. For the purpose of the present invention, no technical distinction will be drawn between the terms "dyes" and "pigments". Thus, those terms will be considered synonymous with each other and with the term colorant as defined herein.

Figure 6:
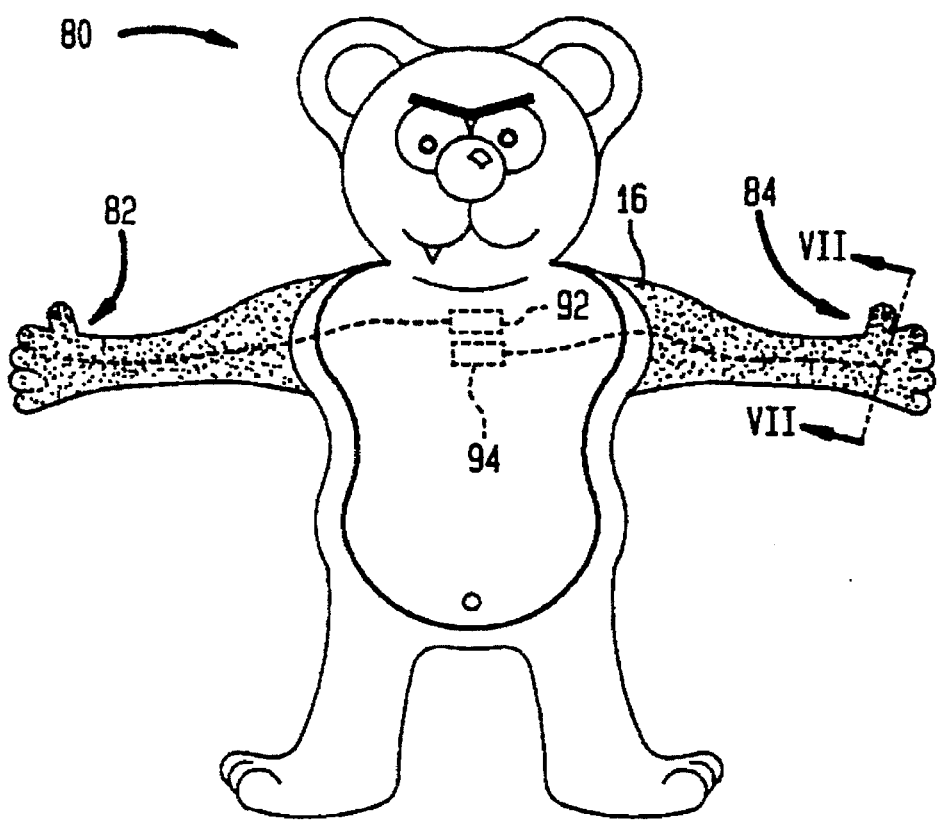
FIG. 6 is a diagrammatic sketch of a children's toy including the electrical system of the present invention.

As clearly shown in the cross-sectional views of FIGS. 1, 4 and 6 of the preferred embodiments of the present invention, the top composition layer 16 of the multi-layer conductive composition is arranged on top of a pair of spaced portions (which may be in the form of stripes) 12 and 14 of the bottom composition layer. One primary difference between the top and bottom composition layers is that the conductivity of the bottom layer is greater than the conductivity of the top layer.

The difference in the levels of conductivity between the top composition layer and the bottom composition layer may be chosen so that vertical conductivity can be obtained. That is, the top layer will have sufficient conductivity to permit current to flow along the relatively small distance defined by the z axis thereof (i.e., substantially normal to the plane of the composition surface), while prohibiting current from flowing along the x and y axes thereof (i.e., substantially parallel to the plane of the composition surface) as indicated by the axis legend shown in FIG. 1. At the same time, the relatively high level of conductivity of the bottom composition layer will permit current to flow along the x, y and z axes thereof in order to obtain proper operation of an electrical system which will be described hereinbelow. It should be appreciated that vertical conductivity need not be utilized in all embodiments of the present invention. Thus, the conductivity of the top composition layer may be selected so that current will be permitted to flow along the x, y and z axes. However, even in this alternate embodiment, the conductivity of the bottom composition layer will be greater than the conductivity of the top composition layer.

The top composition layer preferably comprises between about 5%–30% of conductive materials by weight. More preferably, conductive materials are present in an amount of between about 10% and 25% by weight of the top composition layer. Conductive materials may comprise any of the conductive materials discussed above. The range of conductive materials of the top layer should be selected to provide a relatively low level of conductivity (i.e., a relatively high level of resistivity, as compared to the bottom composition layer, which may be in the range of between about 100 KΩ–20 MΩ per square). The aforementioned ranges of conductivity/resistivity and the percentage of conductive material in the top composition layer is provided by way of example of the preferred ranges. Thus, conductivity/resistivity levels above or below the aforementioned ranges may be obtained while remaining within the scope of the present invention.

Figure 2:
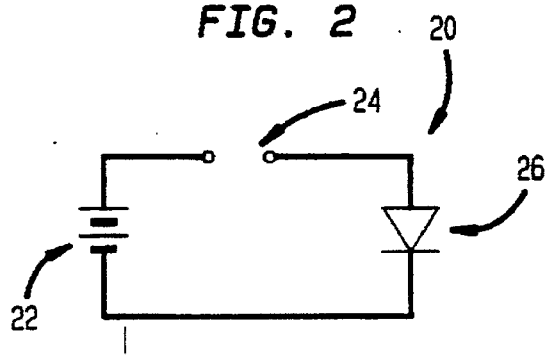
FIG. 2 is a simplified schematic view of an electrical system of the present invention.
Figure 3:
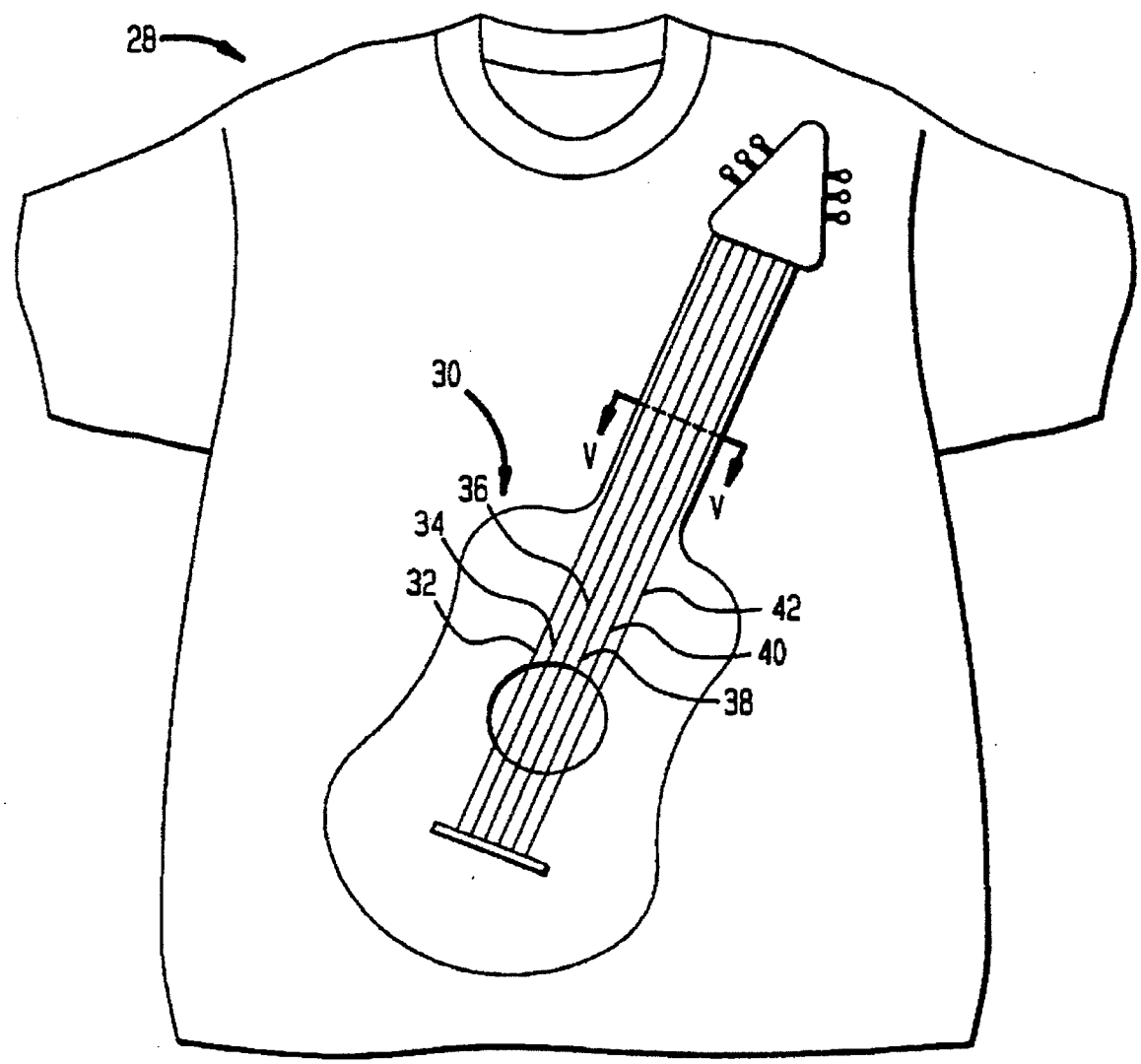
FIG. 3 is a diagrammatic sketch of an article of clothing including the electrical system of the present invention.
Figure 5:
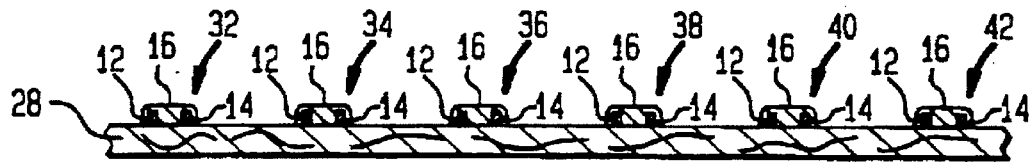
FIG. 5 is an enlarged cross-sectional cut away view taken along line V—V of the article shown in FIG. 3.

Optionally, the top composition layer comprises a greater amount of colorant than the bottom composition layer so that the bottom composition layer is completely hidden from view when the multi-layer conductive composition is applied to a substrate as part of an electrical system, such as the electrical systems depicted in FIGS. 2, 3 and 5.

In a preferred embodiment, the top composition layer will display desired decorative properties based on a desired coloring effect. The amount of colorant within the top composition layer may be selected to provide colors to the present multi-layer conductive composition which were not heretofore obtainable when using conductive compositions. For this reason, it may not be desirable to use certain conductive materials as part of the top composition layer which will affect the color thereof. For example, graphite or carbon black may not be desired for certain applications. Conductive materials that have little affect on the appearance of the top composition layer, and the appearance of the overall multi-layer of conductive composition are particularly desirable in certain applications. To this end, silver coated glass spheres and fibers and doped tin oxide coated mica or silica have been found to have little color shifting affect when used in the relatively small quantities that the top composition layer requires. Further small quantities of less than desirable conductive materials can be used to obtain the desired conductivity and color of the top composition layer. It also possible to use more than one conductive material.

The resin may be present in an amount of between about 5%–75% by weight in the top composition layer. More preferably, the resin is present in an amount of between about 25% and 35% by weight of the top composition layer. The particular type of resin desired may vary as a matter of design choice. To this end, various resins, including those described hereinabove in connection with the bottom composition layer may be used as a binding material for the top composition layer. Further, resin amounts greater or less than the aforementioned ranges may be used within the scope of the present invention.

In preferred embodiments where the top composition layer includes a vehicle in which the resin is dissolved or dispersed, the vehicle may comprise the same ingredients discussed above in connection with the bottom composition layer.

The top composition layer preferably comprises pigment in an amount of between about 1%–60%. It should be understood that pigment is not required in all embodiments of the present invention. However, selected pigments will be incorporated into the top composition layer where it is desired to achieve the appearance of selected colors. Examples of suitable pigments include inorganic pigments such as metal oxides, including iron, titanium, zinc, cobalt and chromium oxides. Earth colored pigments may be used to impart colors such as siennas, ocras and umbras. Lead based pigments such as lead chromates can also be used. Organic pigments may be used including animal-based compounds including rhodopsin and melanin. Organic vegetable derived pigments include chlorophyll, xanthophyll, litmus, flavon and carotene. Mineral pigments and finally synthetic pigments such as phthalocyanine, lithols, toluidine, para red toners, lakes and the like may also be used. Useful pigments are also set forth in *The Condensed Chemical Dictionary*, 8th Edition, Van Nostrand Rheinhold (p.695). Other useful dyes are listed in The Condensed Chemical Dictionary at page 338. Examples of well known natural dyes include madder, cochineal, logwood and indigo. Synthetic organic dyes may also be used. These dyes may be soluble in water or organic solutions. Other useful colorants which may be used in connection with the present invention include nitro dyes, amino ketone dyes, ketone-imine dyes, methine dyes, nitro diphenyl amine dyes, quinoline dyes, amino naphthoquinone dyes, coumarin dyes and anthraquinone dyes as well as azo dyes such as monoazo dyes and disazo dyes. Other dyes include indigold and anthraquinoid dyes. It should be appreciated that many other colorants other than those listed hereinabove, may be used within the scope of the present invention.

Additional pigments and dyes may also be used to provide the multi-layer of conductive compositions of the present invention with colors which have not yet heretofore been achieved when using conductive compositions. For example, vibrant colors, or hard to match or simulate colors may be obtained because the top composition layer may comprise a relatively large amount of pigment as compared to the bottom composition layer, while remaining at least minimally conductive.

The multi-layer conductive composition of the present invention could be applied to various substrates by first applying the bottom composition layer in a desired pattern and then applying the top composition layer to cover the previously applied bottom composition layer. The bottom and top composition layers may be applied by knife coating, blade coating, air knife coating, reverse roll coating, gravure coating, transfer coating, roll coating, hot melt coating, spray coating, calendering, saturation, vacuum metallizing, laminating, dipping, extrusion, electrodeposition, powder coating techniques, screen printing—flat and rotary, lithography or offset printing, letterpress, flexography, gravure, pad printing, transfer printing, brushing, offset printing, decal application methods, ink jet printing, thermography and xerography, or other methods of applying surface coatings besides those set forth above may also be used.

After the bottom composition layer is applied in a desired design of the surface of a substrate, it may be desirable to perform drying operations. This will be particularly desirable in cases where the bottom composition layer remains wet for a certain period of time after initial application. Drying operations may not be required when the bottom composition layer is applied by extrusion or bulk molding techniques. Various known techniques for drying, or curing, conductive compositions after they have been applied to the surface of a substrate may be employed.

In certain conditions, it may be beneficial to only partially dry the bottom composition layer. Under certain circumstances, the bottom composition layer should only be dried to a sufficient extent to prevent damage due to handling or application of the top composition layer. After the bottom composition layer is dried to a desired extent, the top composition layer may be applied by any of the aforementioned coating techniques. It may then be desirable to perform final drying, or curing, steps to the overall multi-layer conductive composition.

Although the particular materials of the top and bottom composition layers of the multi-layer conductive composition may vary in alternate embodiments depending upon the particular industrial or consumer use intended, preferred examples of ingredients of the top and bottom composition layers follows. It should be appreciated that many variations on the following list of ingredients may be used within the scope of the present invention.

I. System For Plastic Substrates

A sprayable composition bottom layer may include the following ingredients:

| Ingredient | Percent of comp. by weight | Manufacturer |
| --- | --- | --- |
| R972 Urethane Dispersion | 29.8 | Zeneca |
| Patcoat 841 Defoamer | 1.0 | C. J. Patterson |
| D3 Silver Powder | 45.2 | IIRP Metals |
| 135 Silver Flake | 24 | Techniks |

A top composition layer for use in combination with the aforementioned bottom composition layer is as follows:

| Ingredient | Percent of comp. by weight | Manufacturer |
| --- | --- | --- |
| R972 Urethane Dispersion | 51.6 | |
| Silver Coated Fiberglass | 14 | Potter |
| 841 Defoamer | 1.3 | |
| Pan White Dispersion | 31.4 | Pan Chemical |
| Yellow Dispersion #5454 | 0.6 | Daniels |
| Red Dispersion #5673 | 0.3 | Daniels |
| Orange Dispersion | 0.8 | Daniels |

II. A System For Fabrics

A screen printable bottom composition layer may include the following ingredients:

| Ingredient | Percent of comp. by weight | Manufacturer |
| --- | --- | --- |
| WAFX 1001 White | 85 | Union Ink |
| Combination Resin Dispersion and white pigment, adjusted for screen printing Silver Coated Fiberglass | 15 | Potter |

A top composition layer for use in combination with the above bottom composition layer may include:

| Ingredient | Percent of comp. by weight | Manufacturer |
| --- | --- | --- |
| WAFX 1001 White | 50 | |
| #135 Silver Flake | 17.5 | |
| D3 Silver Powder | 32.5 | |

III. A System for Plastics, using a non precious metal conductor

A sprayable bottom composition layer may include the following:

| Ingredient | Percent of comp. by weight | Manufacturer |
| --- | --- | --- |
| R972 | 67.2 | |
| 841 Defoamer | 1.5 | |
| RM8 Rheology Modifier | 0.3 | Rohm and Haas |
| Zelec 1410M Mica flakes coated with antimony doped tin oxide | 30.0 | Dupont |
| Propylene Glycol | 1.0 | | and a top composition layer for use in combination with the bottom composition layer may include:

| Ingredient | Percent of comp. by weight | Manufacturer |
| --- | --- | --- |
| R972 | 66.7 | |
| 841 Defoamer | 1.6 | |
| RM8 | 0.5 | |
| IWO-125B White | 13.4 | Pan Chemical |
| FW6-114 | 1.0 | Pan Chemical |
| FW3-80 | 0.5 | Pan Chemical |
| Zelec 1410M | 16.3 | |

The multi-layer conductive composition 10 shown in FIG. 1 can be used in a preferred embodiment as part of an electrical system. A simplified circuit schematic of an electrical system in accordance with the present invention is denoted by reference numeral 20 in FIG. 2. As will be described further below, the multi-layer conductive composition 10 may function as a touch sensitive direct switching element or a low current trigger switch which closes when contacted at a predetermined location to complete a circuit.

The simplified electrical circuit 20 includes a power supply 22 which may be any device capable of generating an output current for driving one or more circuit elements (current operated modules) 26 such as a light emitting diode (LED) or a sound generating device or other current operated circuit components. The power supply 22 may be connected to circuit component 26 through touch sensitive switch 24 or a low current trigger switch which may be touch actuated to complete the circuit between the power supply 22 and the circuit component 26.

One preferred electrical system in accordance with the present invention is shown in FIGS. 3, 4A, 4B and 5 in connection with an article of wearing apparel such as a shirt 28. In particular, a guitar design of a guitar 30 is applied to the front surface of the shirt 28. The guitar design 30 may be partially or entirely made of the multi-layer conductive composition 10 of the present invention. To this end, the strings 32, 34, 36, 38, 40 and 42 which represent standard guitar notes E, A, D, G, B and E respectively, include the multi-layer conductive composition 10. The remaining portions of the guitar design 30 may also include the multi-layer conductive composition 10 or may be made of various other materials such as fabric stitching, other compositions, and the like.

Figure 4B:
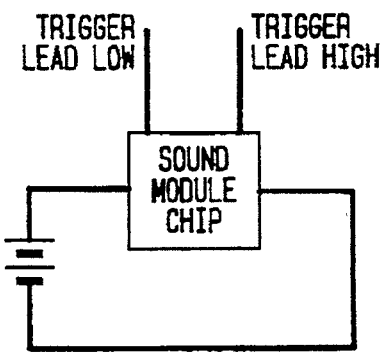
FIG. 4B is an additional simplified schematic of an electrical system used in connection with the embodiment shown in FIG. 3.
Figure 4A:
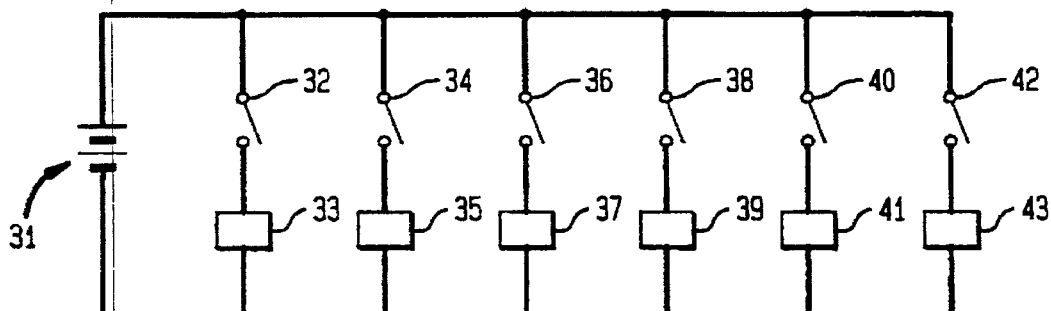
FIG. 4A is a simplified schematic of an electrical system used in connection with the embodiment shown in FIG. 3.

Simplified schematic diagrams representing the electrical system of FIG. 3 is illustrated in FIGS. 4A and 4B. A single power source 31, such as a battery or the like, may be used. The power source 31 is not shown in FIG. 3 as it may be placed in a hidden internal pocket so that it will not be visible to detract attention from the guitar design 30 on the front of the shirt 28. Each of the string designs 32–42 are shown in FIG. 4A as comprising touch sensitive switches arranged in parallel with each other so that selective activation of separate sound producing circuits 33, 35, 37, 39, 41 and 43 can be obtained. Each of the sound producing circuits may be designed to produce a unique sound representative of the notes E, A, D, G, D and E, respectively, of an electric guitar. It should be appreciated that in a preferred embodiment of the present invention, a single sound module chip may include the separate sound producing circuits 33, 35, 37, 39, 41 and 43. In particular, FIG. 4B illustrates a further simplified schematic diagram of an electrical system that may be used with the guitar design 30 shown in FIG. 3.

The sound module chip shown in FIG. 4B is illustrated as including a trigger lead low and a trigger lead high. These trigger leads are representative of the guitar strings 32, 34, 36, 38, 40 and 42. The actual design would include six separate high trigger leads and six separate low trigger leads wherein each of the low trigger leads would be tied to common, and each of the high trigger leads would be independently conductive with respect to a separate sound producing circuits 33, 35, 37, 39, 41 and 43 within the sound module chip.

One of ordinary skill in the art would understand that the multi-layer conductive composition of the present invention can be used as a conductor for current flow in numerous circuit designs. Thus, the overly simplified schematic circuit diagrams shown in FIGS. 4A and 4B should be taken by way of illustration only.

FIG. 5 illustrates a cross-sectional view taken along line V—V of FIG. 3. In this embodiment, each of the six strings 32–42 are made of the multi-layer conductive composition 10 of the present invention. They are illustrated in FIG. 5 as comprising a pair of bottom composition stripes 12 and 14 spaced at a small distance from each other denoted by reference letter "d". Each string design includes a top composition layer placed over a pair of spaced portions of the bottom composition layer so that it has the appearance of a single composition. With particular reference to FIG. 5, each of the string designs 32, 34, 36, 38, 40 and 42 includes spaced bottom composition stripes 12 and 14 and a top composition layer 16 arranged thereon.

As can also be appreciated from the disclosure in FIG. 5, each of the bottom composition stripes of string design 32–42 are applied adjacent to the surface of the shirt 28. To this end, the bottom composition layer should have sufficient adhesion properties to adhere to the surface of the fabric shirt 28. Alternatively, a base coat of a separate composition may be applied to the surface of the shirt 28. In this embodiment, the bottom composition stripes 12 and 14 of the present multi-layer conductive composition will then be applied to the base coat composition. It should be appreciated that any additional composition layer or layers arranged beneath the bottom conductive composition of the present invention will not affect the vertically conductive characteristics obtained by the combination of the top composition layer and the bottom conductive composition of the present invention.

In order to operate the novelty shirt shown in FIG. 3, a person may selectively touch one or more of the string designs 32–42. Such touching would actuate the touch sensitive switches to a closed position so that current will be permitted to flow from the power source 31 to the particular sound producing circuit 33–43 associated with corresponding string designs 32–42. For instance, in order to produce the sounds associated with the guitar notes D, G and B, a person must simply touch string designs 36, 38 and 40 to cause current to flow to sound producing circuits 37, 39 and 41, respectively.

An aesthetic advantage obtained by using the multi-layer conductive composition of the present invention in the embodiment shown in FIG. 3 is that the top composition layer 16 may have a sufficient amount of colorant to hide or mask the corresponding bottom composition stripes 12 and 14. Thus, the guitar design 30 will be enhanced as it may have a realistic appearance with six strings, as opposed to twelve. It should be appreciated that the distance d between the pairs of respective bottom composition stripes 12 and 14 should be small enough to assure that a person who touches the corresponding top composition layer 16 will create a short circuit condition across the distance d when the selected string designs 32, 34, 36, 38, 40 or 42 are touched. If a short circuit condition is not created between each of the pairs of bottom composition stripes 12 and 14, the corresponding touch sensitive switches will not close and the sound producing circuits will not be activated.

Figure 7:
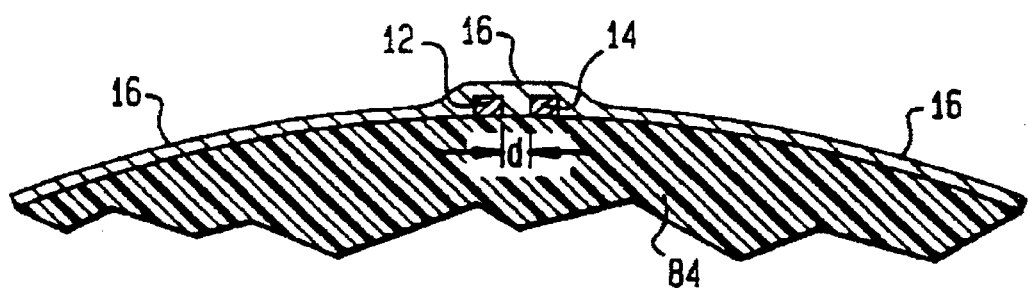
FIG. 7 is an enlarged cross-sectional cut away view taken along line VII—VII of the toy shown in FIG. 6.

Another embodiment of an electrical system in accordance with the present invention is shown in FIGS. 6 and 7. In this embodiment, the multi-layer conductive composition is applied to the surface of a toy doll 80. In order to create a relatively life-like appearance, the multi-layer conductive composition may have a sufficient amount of pigment in the top composition layer 16 to create a flesh-like colored appearance.

Use of the present multi-layer conductive composition on toy doll 80 provides at least two advantages which are not obtainable by use of prior art conductive compositions. The first advantage is to be able to provide flesh-like color to the multi-layer conductive composition. The second advantage is that the continuous top layer 16 of the multi-layer conductive composition will hide the stripes 12 and 14 of the bottom composition layer so that a more pleasing appearance can be obtained.

As shown in FIG. 6, the toy doll includes a right hand 82 and a left hand 84. The electrical system includes a power supply (not shown) which may be mounted in a hidden location on or within the toy doll 80. A pair of sound producing circuits 92 and 94 (shown in phantom) are arranged within the toy doll 80 in conjunction with separate corresponding speakers. The electrical circuit which corresponds to the electrical system of FIG. 6 is similar to the simplified schematic diagram of FIG. 4 in that it may include a single power supply, a pair of touch-sensitive switches and a pair of sound producing circuits in parallel with each other. The multi-layer conductive composition will act as the touch-sensitive switches and includes a pair of spaced bottom layer stripes 12 and 14 which may be separated by a small distance d. This distance may vary as a matter of design choice but should be small enough to assure a temporary short circuit condition will arise when a person touches the top composition layer 16 at a location adjacent to the bottom composition stripes 12 and 14. The electrical circuit associated with the right hand 82 may be activated when a person touches or grabs it at a location on top of the spaced stripes 12 and 14 of the bottom composition layer so that current can flow from the power source to sound producing circuit 92. The sound producing circuit 92 will then be activated so that the doll will appear to speak the phrase "I like when you hold my hand."

The electrical circuit associated with the left hand 84 of the doll 80 may be activated in a similar manner by touching or grabbing it so that a short circuit condition is temporarily created between the pair of bottom conductive stripes 12 and 14 associated with the left hand 84. This will permit current to flow from a power source to sound producing circuit 94 so that the doll will appear to say "Will you play with me?". The bottom conductive stripes 12 and 14 of the multi-layer conductive composition may be applied directly to the surface of the doll 80 as shown in the cross-sectional depiction of FIG. 7. Alternatively, the bottom composition stripes 12 and 14 may be applied to one or more layers of additional base composition as discussed above in connection with the shirt embodiment of FIG. 3. The conductive bottom composition stripes 12 and 14 will be entirely hidden from view by the flesh-colored top composition layer 16 applied thereto. This feature of the present invention can be best appreciated from FIG. 7.

As discussed above, the multi-layer conductive composition is vertically conductive in that current is permitted through flow to the z-axis of the top composition layer 16, while it is substantially prevented from flowing along the x and y axes of the top composition layer 16 which extend parallel to the surface thereof. The stripes 12 and 14 of the bottom composition layer have a sufficiently high level of conductivity so that current is permitted to flow along the x, y and z axes. This feature of the present invention is particularly advantageous as it permits selective actuation of current-operated modules, such as sound producing circuits 92 and 94 while at the same time it prevents short circuit conditions from occurring between sound-producing circuits 92 and 94. As can be appreciated, the top composition layer 16 can be applied over the entire surface of the doll 80 while maintaining proper operation of the electrical system. If prior art conductive compositions were applied on top of the bottom conductive stripes 12 and 14, short circuit conditions would be created upon touching either the right hand 82 or left hand 84. Such a short circuit condition would arise because prior art conductive compositions are not vertically conductive as is the multi-layer conductive composition of the present invention.

In addition to consumer related uses of the present multi-layer conductive compositions in electrical systems, many industrial advantages may be obtained. To this end, the multi-layer conductive composition of the present invention can be used as part of an electrical system in various industrial applications where a power source is electrically connected to a current-operated module. Thus, so long as the multi-layer conductive composition of the present invention can handle the desired current flow, it can be used as a means for conducting current in endless applications.

While the foregoing description and figures are directed toward the preferred embodiments of the present invention, it should be appreciated that numerous modifications can be made to various features of the present invention. Indeed, such modifications are encouraged to be made to the present electrical system and the multi-layer conductive composition without departing from the spirit and scope of the invention. Thus, the foregoing description of the preferred embodiments should be taken by way of illustration rather than by way of limitation as the present invention is defined by the claims set forth below.

What is claimed is:

1. An electrical system comprising: at least one current operated module adapted to provide an output response to applied current; a power source for providing current to said at least one current operated module; a substrate; and a multi-layer conductive composition arranged on said substrate for providing an electrical current path between said power source and said at least one current operated module, said multi-layer conductive composition comprising a first composition including electrically conductive material present in an amount sufficient to provide said first composition with a first level of conductivity, said first composition being arranged on said substrate, and a second composition including electrically conductive material present in an amount sufficient to provide said second composition with a second level of conductivity, said second composition being arranged over said first composition, said first level of conductivity of said first composition being greater than said second level of conductivity of said second composition, said second level of conductivity of said second composition is selected so that substantial electric current can flow along the z axis thereof to said first composition while electric current is substantially prevented from flowing along the x and y axes of said second composition, and the first level of conductivity of said first composition is such that electric current can flow along the x, y and z axes thereof, and a pigment present in an amount to provide a desired color to said second composition.

2. The electrical system of claim 1 wherein said first composition further comprises a resin and a vehicle in which said resin is dissolved or dispersed.

3. The electrical system of claim 2 wherein said second composition further comprises a resin, and a vehicle in which said resin is dissolved or dispersed.

4. The electrical system of claim 2 wherein said electrically conductive material of said first composition is present in an amount of between about 5%–80% by weight.

5. The electrical system of claim 4 wherein said electrically conductive material of said first composition is selected from the group consisting of precious metals and non-precious metals.

6. The electrical system of claim 2 wherein said resin of said first composition is present in an amount of between about 5%–60% thereof.

7. The electrical system of claim 6 wherein said resin of said first composition is selected from the group consisting of acrylics, urethanes, epoxies and oxidizing materials.

8. The electrical system of claim 2 wherein said vehicle of said first composition is present in an amount of between about 10%–75% by weight.

9. The electrical system of claim 8 wherein said resin is dissolved in said vehicle of said first composition.

10. The electrical system of claim 8 wherein said resin is dispersed in said vehicle of said first composition.

11. The electrical system of claim 2 wherein said first composition further comprises at least one ingredient selected from the group consisting of flow agents, defoamers, wetting agents, cross-linking agents and curing agents.

12. The electrical system of claim 3 wherein said electrically conductive material of said second composition is present in an amount of between about 5%–30% by weight.

13. The electrical system of claim 12 wherein said electrically conductive material of said second composition is selected from the group consisting of precious metals and non-precious metals.

14. The electrical system of claim 3 wherein said resin of said second composition is present in an amount of between about 5%–75% by weight.

15. The electrical system of claim 14 wherein said resin of said second composition is selected from the group consisting of acrylics, urethanes, epoxies and oxidizing materials.

16. The electrical system of claim 3 wherein said vehicle of said second composition is present in an amount of between about 5%–60% by weight.

17. The electrical system of claim 16 wherein said resin is dissolved in said vehicle of said second composition.

18. The electrical system of claim 16 wherein said resin is dispersed in said vehicle of said second composition.

19. The electrical system of claim 3 wherein said second composition further comprises at least one ingredient selected from the group consisting of flow agents, defoamers, wetting agents, cross-linking agents and curing agents.

20. The electrical system of claim 3 wherein said pigment of said second composition is present in an amount of between about 1%–60% by weight.

21. The electrical system of claim 3 wherein said pigment is substantially electrically non-conductive.

22. The electrical system of claim 1 wherein said second composition entirely masks said first composition.

23. The electrical system of claim 1 wherein said second composition partially masks said first composition.

* * * * *